United States Patent [19]

Senba et al.

[11] Patent Number: 5,310,965
[45] Date of Patent: May 10, 1994

[54] MULTI-LEVEL WIRING STRUCTURE HAVING AN ORGANIC INTERLAYER INSULATING FILM

[75] Inventors: Naoji Senba; Atsushi Nishizawa, both of Tokyo, Japan

[73] Assignee: NEC Corporation, Tokyo, Japan

[21] Appl. No.: 936,300

[22] Filed: Aug. 28, 1992

[30] Foreign Application Priority Data

Aug. 28, 1991 [JP] Japan ................................. 3-215697
Aug. 28, 1991 [JP] Japan ................................. 3-215698

[51] Int. Cl.$^5$ ................................................ H05K 1/00
[52] U.S. Cl. ................................ 174/250; 174/257; 174/262; 361/767; 361/772; 361/784
[58] Field of Search ............... 174/250, 257, 260, 262, 174/263, 266; 361/399, 400, 403, 406, 414

[56] References Cited

U.S. PATENT DOCUMENTS

| | | | |
|---|---|---|---|
| 4,125,648 | 11/1978 | Vratny | . |
| 4,541,035 | 9/1985 | Carlson et al. | 174/257 |
| 5,111,278 | 5/1992 | Eichelberger | 357/75 |
| 5,144,747 | 9/1992 | Eichelberger | 29/840 |
| 5,152,869 | 10/1992 | Ferraris et al. | . |

Primary Examiner—Leo P. Picard
Assistant Examiner—Cheryl R. Figlin
Attorney, Agent, or Firm—Burns, Doane, Swecker & Mathis

[57] ABSTRACT

To perform a stable wire bonding connecting against a multi-level wiring board using an organic material for the interlayer insulating film, a silicon oxide film and organic interlayer insulating films, for example, polyimide layers, and the first to the fourth level wirings, including a nickel layer by plating are formed on the surface of the silicon substrate as a base in order. By adjusting the thickness of the nickel layer in the wiring, the total Vickers hardness from the substrate to each wiring is adjusted to more than 100, respectively.

24 Claims, 6 Drawing Sheets

MULTI-LEVEL WIRING STRUCTURE HAVING AN ORGANIC INTERLAYER INSULATING FILM

BACKGROUND OF THE INVENTION

1. Field of the Invention

The present invention relates to a multi-level wiring structure and, more particularly, to a multi-level wiring structure using an organic insulating film as an interlayer insulating film.

2. Description of the Prior Art

It has been known that a multi-level wiring structure is formed by using an inorganic insulating film as the interlayer insulating film. As an example of the structure, a three level wiring structure may be considered. In the structure, a first wiring layer is formed on a surface of an inorganic insulating base, a first inorganic insulating film, for example a silicon oxide film, is formed to cover the surface of the first wiring layer and the inorganic insulating base, consecutively. At the surface of the inorganic insulating film, a second wiring layer is formed. A second inorganic insulating film, for example a silicon oxide film, is formed to cover the surface of the second wiring layer and the first inorganic insulating film, consecutively. At the surface of the second insulating film, a third wiring layer is formed. A via hole is formed at a predetermined part of the first inorganic insulating film, and the first wiring layer and the second wiring layer are connected electrically by filling metal in the hole. In the case of the multi-level wiring structure using the inorganic insulating film as the interlayer insulating film, the hardness of the silicon oxide film is more than 1000. Therefore, one can carry out wire bonding to any bonding pad even if the pad is made of each part of the first, the second or the third wiring layer.

Now a three level wiring structure made by using an organic insulating material such as polyimide resin or epoxy resin instead of the first and the second inorganic insulating film for interlayer insulating film will be considered. In this prototype, as the first wiring layer is formed on the surface of the inorganic insulating layer, wire bonding is carried out well even if the bonding pad is made of one part of the first wiring layer. However, the wire bonding to a bonding pad made of one part of the second and the third wiring layers is not carried out stably. The reason is that as the hardness of the organic insulating film is much smaller than that of inorganic insulating film, the force of pressure welding is absorbed even if the bonding wire is pushed to the pad.

BRIEF SUMMARY OF THE INVENTION

Object of the Invention

Therefore, an object of the present invention is to provide a multi-level wiring structure having a bonding pad such that wire bonding is carried out stably even if the bonding pad is formed on a surface of an organic insulating film.

Summary of the Invention

A multi-level wiring structure according to the invention comprises a first level wiring having a laminated structure and formed on a surface of an inorganic insulating layer; an organic insulating film covering the surface of the first wiring layer and the surface of the inorganic insulating layer consecutively; and a second wiring layer formed on the surface of the organic insulating film and having a laminated structure involving a nickel layer, and one part of the second wiring serving as a bonding pad, characterized in that total Vickers hardness of the section between the inorganic insulating layer and the second wiring layer is more than 100.

According to the invention, one can accomplish wire bonding stably to the bonding pad formed in the second wiring layer formed on the surface of inorganic insulating film as well as to the first wiring layer formed on the inorganic insulating layer.

BRIEF DESCRIPTION OF THE DRAWINGS

The above-mentioned and other subjects, features and advantages of this invention will become more apparent by reference to the following detailed description of the invention taken in conjunction with the accompanying drawings, wherein.

DETAILED DESCRIPTION OF THE PREFERRED EMBODIMENTS

Before the description of the embodiments of the present invention, a prototype of the prior art will be described in detail.

Figure 1:
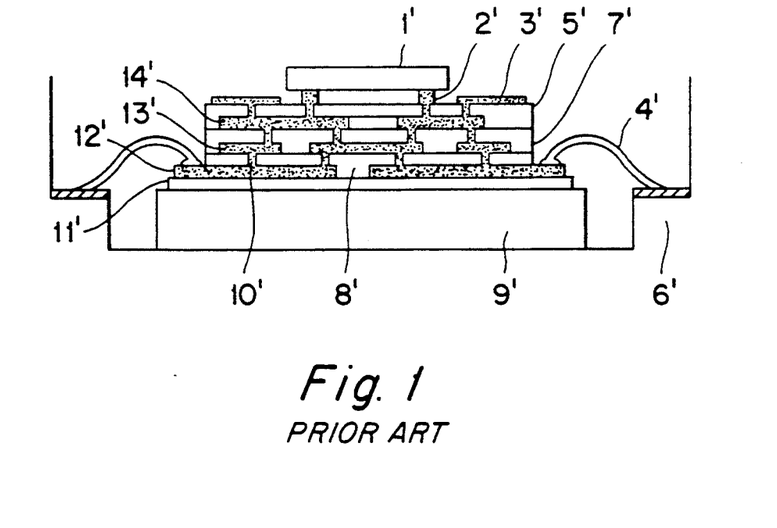
FIG. 1 is a cross-sectional view of a multi-level wiring structure to explain a prototype of related art to the invention.

Referring to FIG. 1, the prototype is constructed by forming silicon dioxide film 11' on a silicon substrate 9', and laminating a first metal layer 12', a first polyimide layer 8', a second metal layer 13', a second polyimide layer 7', a third metal layer 14', a third polyimide layer 5', and a fourth metal layer 3' in order. A via hole 10' is provided with the polyimide layer to connect two adjacent metal layers. The multi-level wiring construction is made by using a photolithography, a vacuum evaporation, a sputtering, a metal plating or the like. After making the multi-level wiring structure according to the above-mentioned contents, it is bonded to a package 6' by an adhesive or a soft solder. After this, using a wire bonding method, the multi-level wiring structure and the package 6' are connected using bonding wire 4'.

In the prior art, the polyimide layers, which are soft, absorb the connection energy to connect and make connection a metal layer which can be used to connect for a wire bonding in this multi-level wiring is restricted to the first metal layer 12' alone. This reason is that the hardness of polyimide is only 30–60, while the hardness of the silicon dioxide film 11' is generally more than 1000. According to the prior art, since only the first metal layer can be used to connect the multi-level wiring structure with the package, the structure of the multi-level wiring board becomes complicated. For example, all output terminals of the mounted IC chip 11' are needed to pull out by connecting upper metal layers to the first metal layer through several via holes. Therefore, additional via holes are needed, and it may adversely affect the board size and its yield. That is, there are the problems of increasing design process and product cost, and deteriorating reliability of the board.

Turning now to the drawings, the embodiments of the present invention will be described in detail.

Figure 2A:
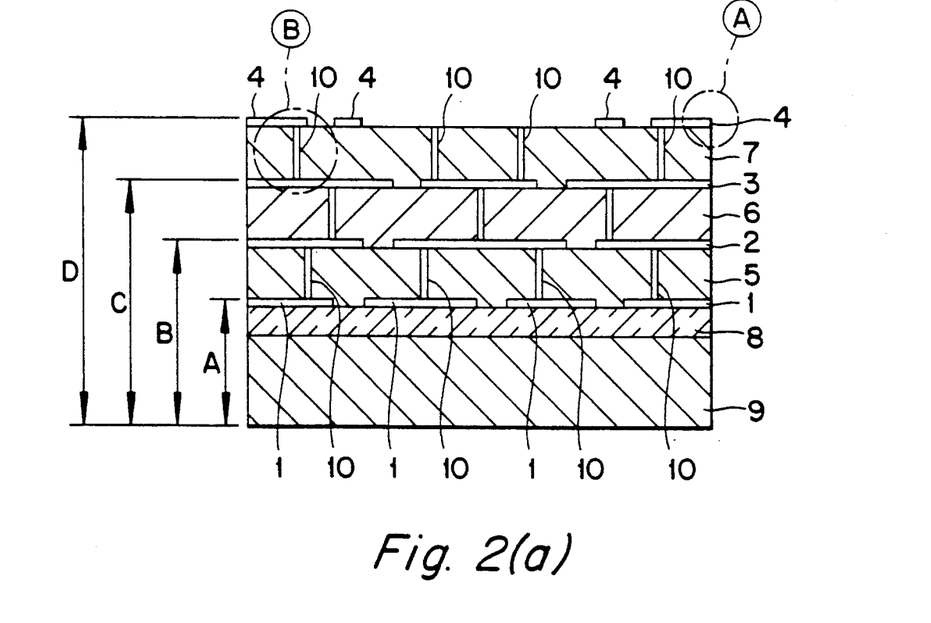
FIG. 2(a) is a cross-sectional view of a multi-level wiring structure according to a first embodiment of the present invention.

Showing in FIG. 2(a) as the first embodiment, a silicon oxide film 8 as the inorganic insulating layer is formed on a silicon substrate 9 serving as a base of insulating materials, semiconductors and conductors. A first level wiring 1 is formed on the surface of the silicon oxide film 8. A first polyimide layer 5, as the organic insulating film, covers the surface of the first level wiring 1 and the silicon oxide film 8, consecutively. Moreover, a second level wiring 2, a second polyimide layer 6, a third level wiring 3, a third polyimide layer 7 and a fourth level wiring 4 are formed by depositing in this order on the first polyimide layer 5. Via holes 10 are provided at portions of the polyimide layer where electric connections are needed between adjacent level wirings. As the via hole 10 is drawn schematically as shown in the FIG. 2(a), in case of polyimide being used as the interlayer insulating film, the hole 10 has a tapered shape shown in FIG. 2(c), as a fragmentary expanded sectional view of the part Ⓑ shown in FIG. 2(a). In other words, a cross vertical section of the via hole 10 has a tapered shape with the angle $\theta$ of 30-70 degrees. At the via hole 10, the fourth level wiring 4 is formed and is made up of an adhesive metal layer 4-1, a barrier metal layer 4-2, a nickel layer by plating 4-3 and a gold layer by plating 4-4, which are laminated in order. Therefore, any additional conductor buried in the hole to connect the third level wiring 3 and the fourth level wiring 4 is not necessary. The process for manufacturing the third polyimide layer 7 having the tapered shape as shown in the FIG. 2(c) will be described below.

Figure 2B:
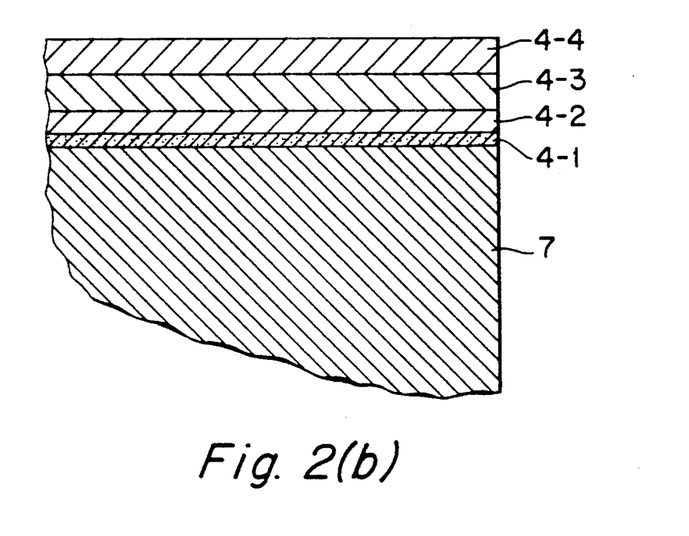
FIGS. 2(b) and (c) are fragmentary enlarged detail views of part Ⓐ and part Ⓑ as shown in FIG. 2(a), respectively.
Figure 2C:
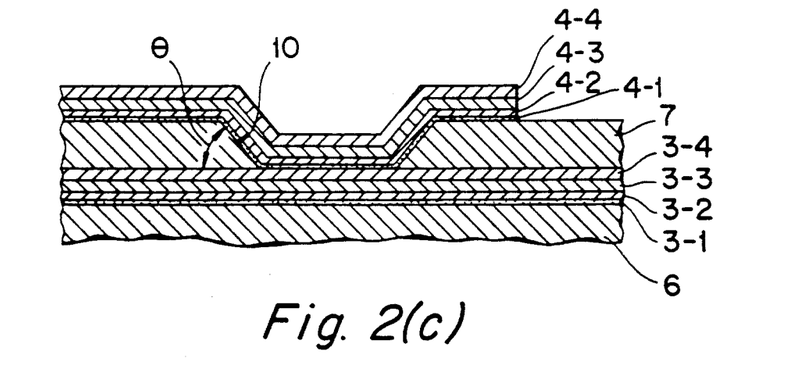

In case of using photosensitive polyimide, the liquid photosensitive polyimide the viscosity of which is 500-1000 cps is dropped to the wafer which was processed until the gold layer by plating 3-4 is made, which is set on a spinner rotating at a rotation rate of 1000-5000 rpm. By action of the centrifugal force, the polyimide is applied to the surface of the gold layer by plating 3-4 evenly. The growth rate of it is about 2-20 $\mu$m/rotation. After this process, a preliminary bake is performed at a temperature of 50°-100° C. and at a time of 30 seconds to 60 minutes. After this pre-bake, a glass mask is set on the exposure equipment and a photolithography is carried out. Next, the wafer is dipped in a developer, and a development is performed, opening the photosensitive polyimide, that is, the via hole 10 is opened at a predetermined part. After this, to stabilize the polyimide, a main bake is performed at a bake temperature of 200°-500° C., and a bake time of 0.5-2 hours. Applying the main bake (post bake) to the wafer, as the shrinkage of the part in the polyimide which is in contact with the gold layer by plating 3-4 is smaller than that of the part in it which is not in contact with it, one can form the polyimide layer having a taper-shaped via hole 10 as shown in FIG. 2(c). In the case of using a photosenseless polyimide, the liquid photosenseless polyimide viscosity of which is 500-1000 cps is dropped to the processed wafer until the gold layer by plating 3-4 is made, which is set on the spinner rotating at a rotation rate with 1000-5000 rpm. By the centrifugal force, the polyimide is applied to the surface of the gold layer by plating 3-4 evenly. The growth rate of it is about 1-2 $\mu$m/rotation. After this, a preliminary bake is performed with a bake temperature of 50°-150° C. and bake time of 30 seconds to 60 minutes. After the pre-bake, a glass mask is set to exposing equipment, and exposure is performed. Next, using developer and accomplishing developing, an opening of the photosenseless polyimide, that is, the via hole 10 is formed. Next, the residual photoresist still deposited on the polyimide is removed by a parting agent, for example methyl ethyl ketone at a temperature of 25°±5° C. and a time of 30-300 minutes. After this, the main bake (post bake), at a temperature of 200°-500° C. and a time of 0.5-2 hours, is carried out to stabilize the polyimide. FIG. 2(b) is a fragmentary enlarged sectional view of the part Ⓐ as shown in FIG. 2(a). As seen in it, the fourth level wiring 4 is composed of the adhesive metal layer 4-1, the barrier metal layer 4-2, the nickel layer by plating 4-3 and the gold layer by plating 4-4, and is formed on the third polyimide layer 7. The fourth level wiring 4 having laminated structure is selected as, for example, a titanium layer 4-1 with thickness of 0.05-1.0 $\mu$m, a copper layer 4-2 with thickness of 0.5-2 $\mu$m, nickel layer by plating 4-3 with thickness of 2-5 $\mu$m, and a gold layer by plating 4-4 with thickness of 0.2-5 $\mu$m. The titanium layer 4-1 is formed, for example, using a sputtering method with a sputtering vacuum of 8±1 m Torr, an arriving vacuum of below $9 \times 10^{-7}$ Torr at most, an applying voltage of 260±10 V, an applying current of 6.2±0.1 A, and a sputtering time of 10 minutes. The copper layer 4-2 is formed using a vacuum evaporation method, a sputtering method, a metal plating method or the like. The nickel layer 4-3 and the gold layer 4-4 are formed using an electroless plating method or an electrolytic plating method.

Now as to adjusting the thickness of the nickel layer by plating 4-3, the total Vickers hardness THV from the substrate 9 to the fourth level wiring 4 is adjusted. In this specification, the total Vickers hardness THV from an element A to an element B is defined as the sum total of Vickers hardness HV of the element A, the element B, and other element(s) formed between the element A and the element B. As seen in the figure, the sections A, B, C and D are named for a range from the backside surface of the substrate 9 to the surface of the wiring 1, a range from the backside surface of the substrate 9 to the surface of the wiring 2, a range from the backside surface of the substrate 9 to the surface of wiring 3, and a range from the backside surface of the substrate 9 to the surface of wiring 4, respectively. The total Vickers hardness THV of the section A is defined as the sum total of each Vickers hardness of the substrate 9, the silicon oxide film 8, and the first level wiring 1. When the thickness of the nickel layer by plating in the wiring formed on the polyimide layer of 2-10 $\mu$m in thickness varies 2 $\mu$m, 5 $\mu$m, 10 $\mu$m, and 15 $\mu$m, the total Vickers hardness varies 100-120, 150-250, 250-350, and 300-400, respectively, in accordance with the nickel layer thickness. Using this relationship, and determining the thickness of the nickel layer in the wiring, each of the total Vickers hardness THV of sections B to D as well as section A becomes more than 100, and stable wire bonding can be performed.

Preferably, the total Vickers hardness THV is adjusted to 1000 at most. The wire number which one capillary of a bonding tool can perform for the wire bonding is ordinarily on a level of 50-100 million wirings/one capillary. The capillary is commonly made of a ceramic, a ruby, a tungsten carbide or the like. Therefore, if the hardness of the wiring receiving wire bonding is too high, it results in harmful abrasion of the capillary end, and results in reducing the life of the capillary ⅟₄ to 1/5 of the normal life time of its. Also operability may be lowered and the connecting reliability of the bonding wire may be lowered by deformation of the capillary end. Therefore, the total Vickers hardness THV is preferably 100-1000.

Figure 2D:
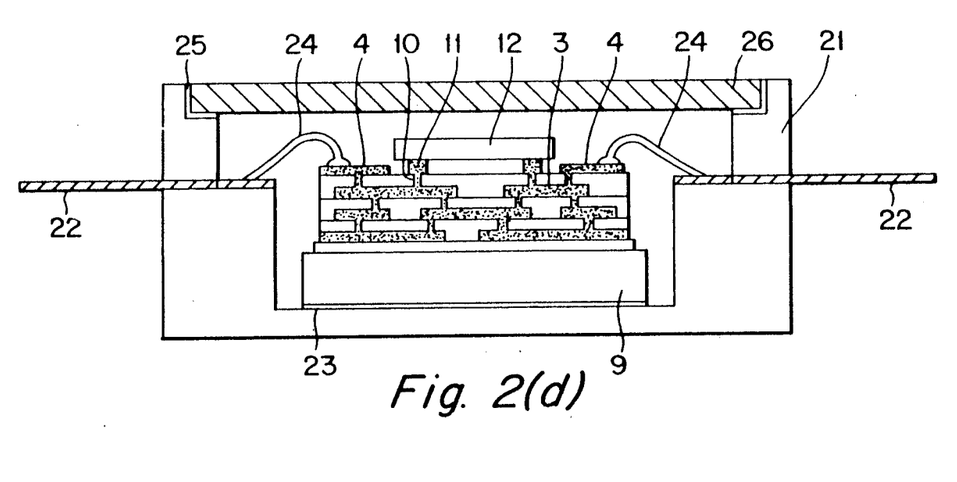
FIG. 2(d) is a cross-sectional view of a state that the multi-level wiring structure shown in FIG. 2(a) is loaded into a package.

As shown in FIG. 2(d), the multi-level wiring structure is loaded to a package 21 made of a ceramic, a COVAR or the like. A face-down IC chip 12 is connected to the third level wiring 3 via a bump 11 and a via hole 10. The backside surface of the substrate 9 is bonded to a bottom of the package 21 using, for example, an epoxy sheet as an adhesive. Outer extending lead 22 is made of COVAR, for example, and in the case of using COVAR for the package 21, an insulating material is formed between the lead 22 and the package 21. The insulating material is, for example, a ceramic, a glass or the like. At a portion, of the lead 22, to which the bonding wire will be bonded, a nickel layer by plating of 1.0-5 μm in thickness and a gold layer by plating of 0.5-5 μm in thickness is laminately formed in order. The gold layer by plating and the bonding pad of the fourth level wiring 4 are connected by the wire 24. A cap 26 made of a ceramic or a COVAR is attached to the package 21 by an adhesive, a soft solder seal or weldment.

According to the present embodiment, as the total Vickers hardness THV of the section D is made up more than 100 by adding the nickel layer in the fourth level wiring 4, as shown in FIG. 2(d), wire bonding can be stably performed to the bonding pad of the fourth level wiring 4.

Figure 3:
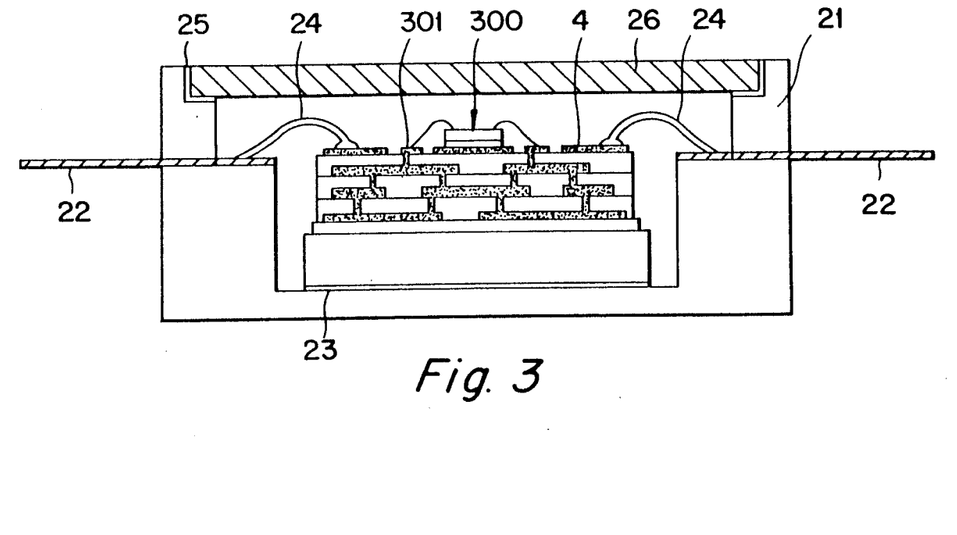
FIG. 3 is a cross-sectional view according to a second embodiment of the present invention.

Now referring to FIG. 3, the second embodiment of the present invention will be described. As shown in the figure, a face-up IC chip 300 is formed on the surface of the fourth level wiring 4, and is connected to the nearby bonding pads 301 formed on the third polyimide layer 7. Adjusting the layer thickness of the nickel layer by plating in the fourth level wiring 4, the wire bonding to the fourth level wiring can be carried out stably. Therefore, the mount of the face-up IC chip becomes possible.

Figure 4A:
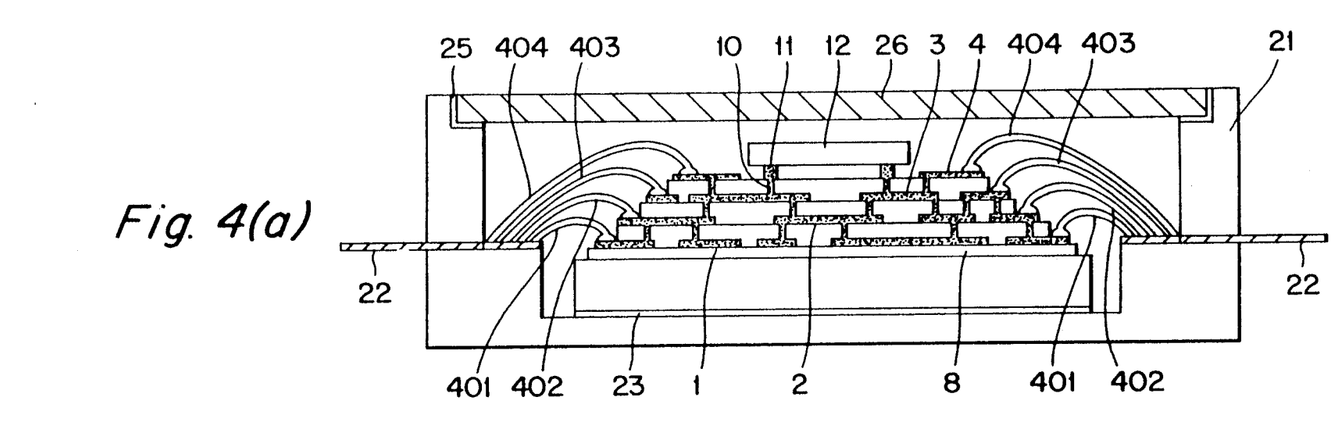
FIG. 4(a) is a cross-sectional view according to a third embodiment of the present invention.
Figure 4B:
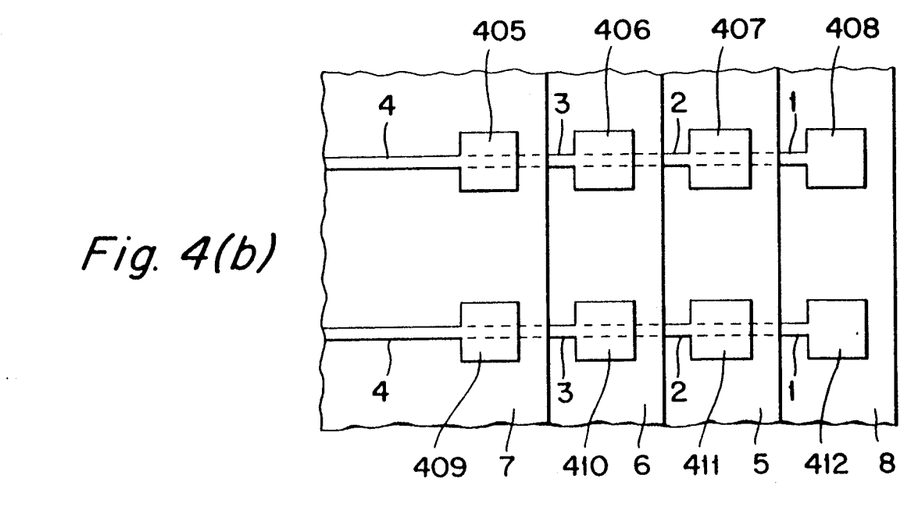
FIGS. 4(b) and (c) are fragmentary plan views of the multi-level wiring structure as shown in FIG. 4(a)
Figure 4C:
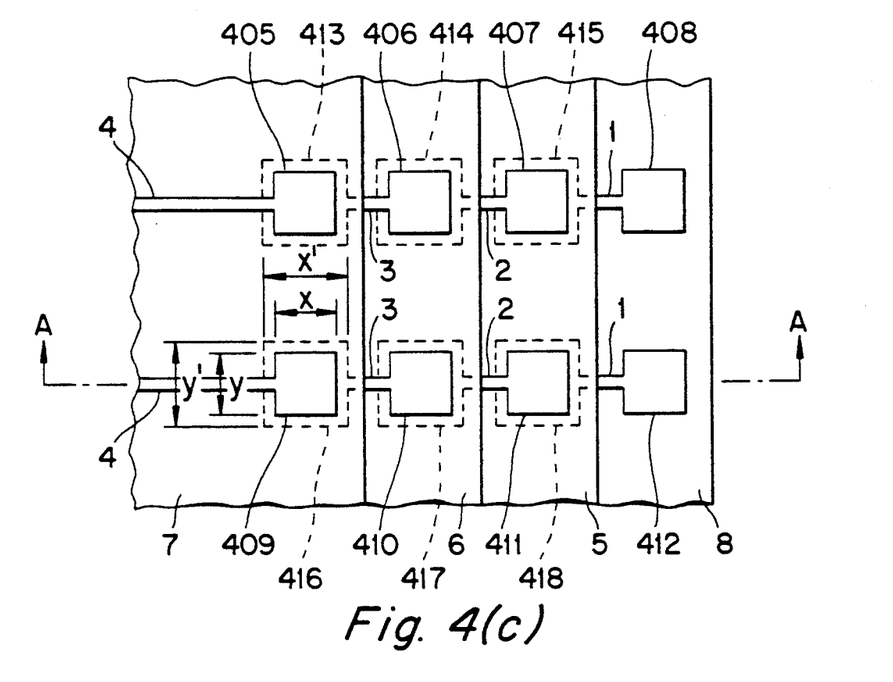
Figure 4D:
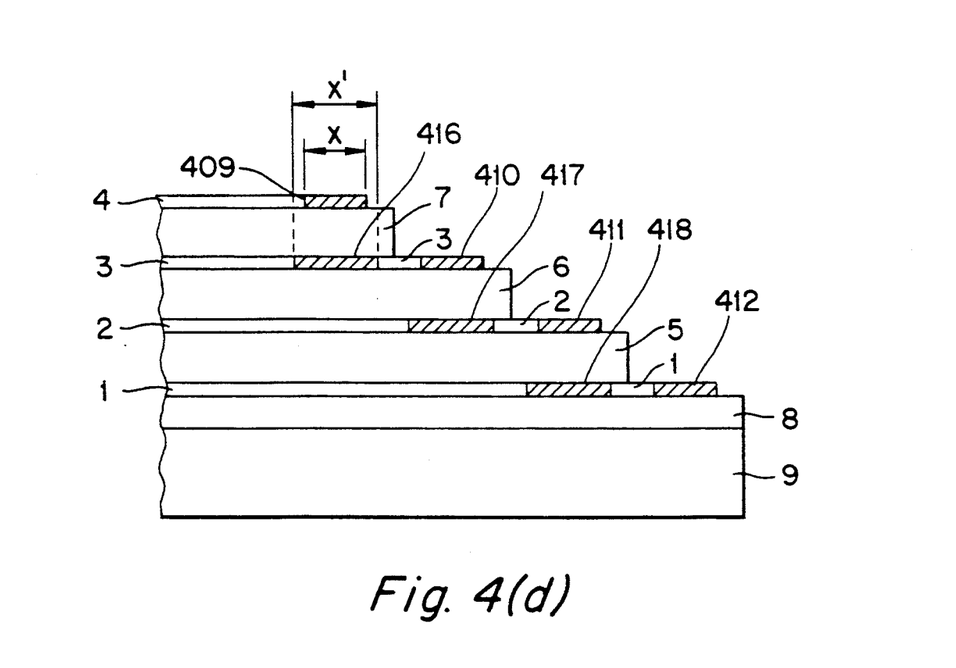
FIG. 4(d) is a cross-sectional view taken generally along the line A—A in FIG. 4(c)
Figure 5A:
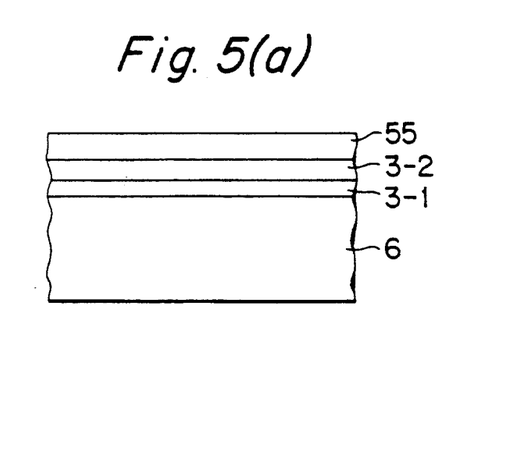
FIGS. 5(a) to (f) are cross-sectional views arranged in order of successive stages in the manufacturing process to explain a method of forming a nickel layer at a bonding pad, selectively.
Figure 5B:
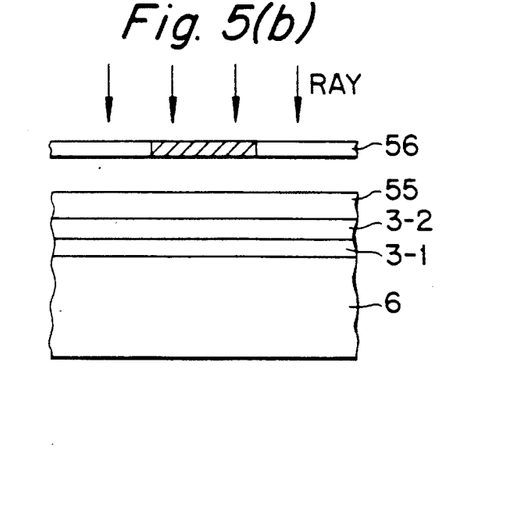

Now referring to the figure, the third embodiment of the present invention will be described. As shown in FIG. 4(a) which is a cross-section with mounted state in a package, the lead 22 of the package 21 is connected to bonding pads of the fourth level wiring 4, the third level wiring 3, the second level wiring 2 and the first level wiring 1 via bonding wires 404, 403, 402 and 401, respectively. One part of the third level wiring 3 is connected to the face-down IC chip 12 through a via hole 10 and a bump 11. In the present embodiment, each thickness of the first polyimide layer through the third polyimide layer being 2-10 μm, the nickel layer by plating of the first level wiring, the second level wiring and the third level wiring is determined to be 2 μm in thickness. In this case, the wire bonding to the bonding pad of the first level wiring 1 formed on the silicon oxide layer 8 can be performed well. In addition, the wire bonding to the bonding pad of the second level wiring, the third level wiring and the fourth level wiring formed on the first polyimide layer, the second polyimide layer and the third polyimide layer as organic insulating films, respectively can also be performed well. FIG. 4(b) is a plan view of a bonding pad part of the multi-level wiring structure shown in FIG. 4(a). One part of the first level wiring 1 serves as bonding pads 408 and 412. One part of the second level wiring 2 serves as bonding pads 407 and 411. One part of the third level wiring 3 serves as bonding pads 406 and 410. One part of the fourth level wiring 4 serves as bonding pads 405 and 409. The first level wiring 1 to the fourth level wiring 4 are formed on the silicon oxide film 8, the first polyimide layer 5 to the third polyimide layer 7, respectively, extending to the left direction in the figure. FIG. 4(c) is a plan view showing an improved bonding pad part of the multi-level wiring structure shown in FIG. 4(b). Broad width parts 413 and 416 are provided with the third level wiring 3, which is formed under the bonding pads 405 and 409 via the third polyimide layer 7, respectively. Broad width parts 414 and 417 are provided with the second level wiring 2, which is formed under the bonding pads 406 and 410 via the second polyimide layer 6, respectively. Broad width parts 415 and 418 are provided with the first level wiring 1, which is formed under the bonding pads 407 and 411 via the first polyimide layer 5, respectively. An area of the broad width parts 413 to 418 are equal to an area of the bonding pads 405 to 407 and 409 to 411, respectively, or broader than the bonding pads, respectively. That is, for example, the length of each side x' and y' of the broad width part 416 is determined to longer than that of each side x and y of the bonding pad 416, as shown in FIG. 4(c). FIG. 4(d) is a cross-sectional view taken along line A—A of FIG. 4(c). Providing the nickel layer by plating with the bonding pads 409 to 411, the wire bonding can be performed to the respective bonding pads well. To accomplish the wire bonding more accurately, the nickel layer by plating is provided with the broad width parts 416 to 418. Referring to FIG. 5(a) to (f), a method for providing the nickel layer by plating with the bonding pad or the broad width part will be explained below. As an example, a case in which the nickel layer by plating 3-3 is provided with broad width part 416 shown in FIG. 4(d) will be described. As shown in FIG. 5(a), for example, a titanium layer as an adhesive metal layer 3-1 is formed on the surface of the second polyimide layer 6 by sputtering or vacuum evaporation. A copper layer as a barrier metal layer 3-2 is formed on the surface of the adhesive metal layer 3-1. Photoresist layer 55 is formed on the surface of the layer 3-2. As seen in FIG. 5(b), the photoresist layer 55 except for a region in which the nickel layer by plating 3-3 will be formed is exposed to light through a mask 56.

Figure 5C:
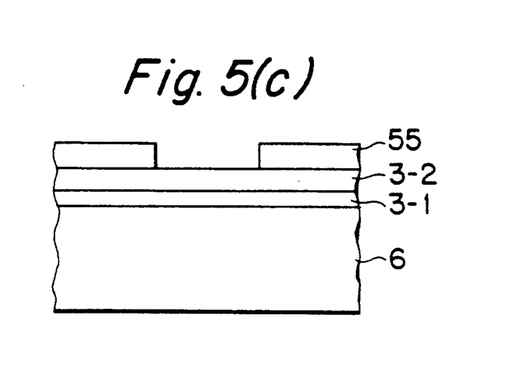
Figure 5D:
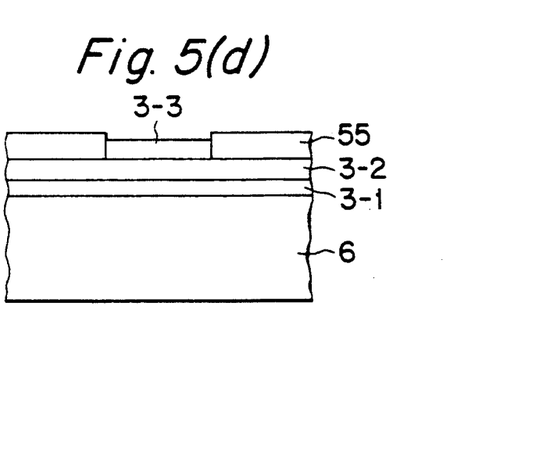
Figure 5E:
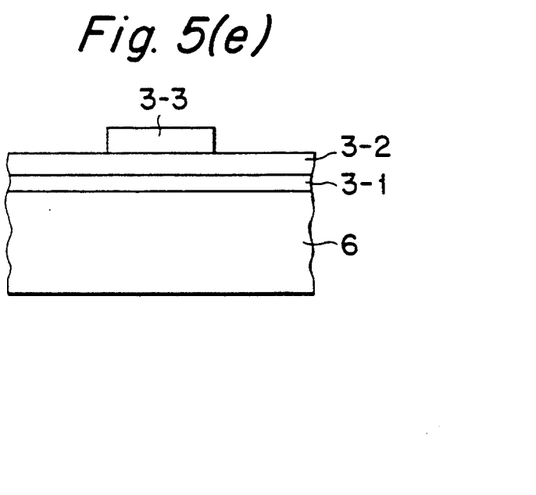
Figure 5F:
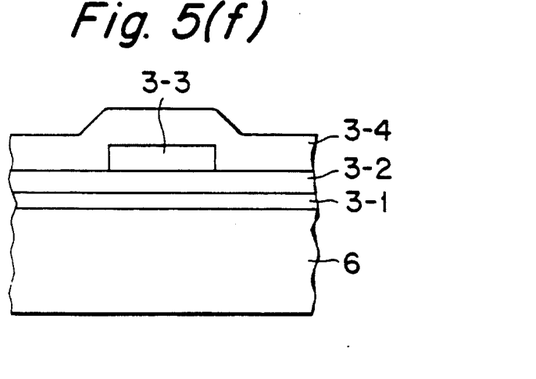

As shown in FIG. 5(c), the photoresist layer 55 is selectively removed. As shown in FIG. 5(d), a nickel layer by plating 3-3 is selectively formed in an opening of the photoresist 55 shown in FIG. 5(c). In the case of the nickel layer 3-3 being formed using electroless plating, an electroless nickel plating solution comprising a nickel sulfate, a sodium acetate, a sodium citrate and a sodium hypophosphite as a main component is kept at a temperature of 70°-80° C. Next, the plating solution is agitated after the structure shown in FIG. 5(c) is steeped in the solution. It is preferred to grow for 10-30 minutes, because the layer growth rate of the plating layer is 7-14 μm/hour. Agitating the solution can prevent boubles, which generate at the growing part of the plating layer, from remaining in the nickel layer. In case of the nickel layer 3-3 being formed using electrolytic plating, an electrolytic nickel plating solution comprising nickel sulfate, nickel chloride and boric acid as a main component is kept at a temperature of 25°-80° C. After steeping the structure shown in FIG. 5(c) and a nickel plate in the plating solution, the wiring 3-1 and 3-2 of the structure and the nickel plate are connected to an anode and a cathode, respectively. After supplying a current of 0.5-1.0 A/dm$^2$ between the two electrodes, the solution is agitated; and the plating layer 3-3 grows with a growth rate of 7-14 μm/hour. After this process, as shown in FIG. 5(e) the photoresist 55 is removed. Finally, a gold plate layer 3-4 which consecutively covers the surface of the nickel plate layer 3-3 and the barrier metal layer 3-2 is formed. Therefore, the nickel layer can be formed by plating 3-3 at the broad width part 416 of the third level wiring 3, selectively.

According to the present embodiment, providing the nickel layer by plating at the bonding pad receiving wire bonding, the total Vickers hardness THV is determined to be more than 100, and wirebonding can be performed to the bonding pads 405 to 407 and 409 to 411, formed on the surface of the polyimide layers 5, 6 and 7, and to bonding pads 408 to 412 formed on the silicon oxide film 8. In addition, providing the broad width part with the wiring which is passing through underneath the bonding pad, a bad influence of the pattern shape of the wiring does not appear in that the bonding pad is formed over the wiring, and the surface of the bonding pad becomes flat and wire can be accomplished bonding stably. In addition, as the nickel layer by plating is also formed at the broad width part underneath the bonding pad, selectively, the total Vickers hardness THV which is necessary for wire bonding can be obtained, and wire bonding can be carried out with more accuracy. As described above, selectively, the nickel layer by plating is formed, and the layer can be prevented from being so hard that stress cannot be absorbed.

Though specific embodiments of the present invention are described above, various modifications can be performed. As for the organic insulating film, an epoxy resin, a Teflon or the like may be used, instead of the polyimide resin. Moreover, in the case of polyimide being used as the interlayer insulating film, chromium, palladium or the like may be used for the adhesive metal layer; and nickel, a copper-palladium alloy, a titanium-copper alloy, platinum, palladium or the like may be used for the barrier metal layer.

Although the invention has been described with reference to specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments that fall within the scope of the invention.

What is claimed is:

1. A multi-level wiring structure, comprising:
a first level wiring of a laminated structure formed on a main surface of an insulating layer, said first level wiring including a nickel layer and a gold layer, said first level wiring having a first bonding pad portion, a broad width portion, a first strip line portion connecting said first bonding pad portion and said broad width portion and a second strip line portion extending from said broad width portion;
a polyimide layer successively covering said second strip line portion, said broad width portion, a part of said first strip line portion and said second strip line portion of said first level wiring and said insulating layer except said first bonding pad portion and a remaining part of said first strip line portion of said first level wiring; and
a second level wiring of a laminated structure formed on a main surface of said polyimide layer, said second level wiring including a nickel layer and a gold layer, said second level wiring having a second bonding pad portion and a third strip line portion extending from said second bonding pad portion, said second bonding pad portion of said second level wiring being formed over said broad width portion of said first level wiring with isolation therebetween by said polyimide layer to thereby have a substantially even surface, each of said first and second bonding pad portions being provided as an external-lead-out terminal for said multi-level wiring structure.

2. The multi-level wiring structure as claimed in claim 1, wherein said polyimide layer includes a via hole having a tapered wall, and said second level wiring comes into contact with said first level wiring at said via hole.

3. A multi-level wiring structure, comprising:
a first level wiring formed on a major surface of an inorganic insulating layer;
an organic insulating film covering said first level wiring and said inorganic insulating layer, successively; and
a second level wiring having a laminated structure formed on a major surface of said organic insulating film, said second level wiring having a bonding pad at an end portion thereof, said bonding pad been composed of an adhesive metal layer formed on said organic insulating film, a barrier metal layer formed on said adhesive metal layer, a nickel layer formed on said barrier metal layer and a gold layer formed on said nickel layer, said nickel layer being formed between said barrier metal layer and said gold layer with such a thickness that the Vickers hardness of a portion composed of said bonding pad, said inorganic insulating film, said first level wiring and said inorganic insulating film is more than 100.

4. The multi-level wiring structure as claimed in claim 3, wherein said first level wiring passes underneath said bonding pad of said second level wiring, and said first level wiring includes a broad width part having an area equal to or greater than that of said bonding pad, said broad width part being located underneath said bonding pad.

5. The multi-level wiring structure as claimed in claim 4, wherein a nickel layer is provided with said broad width part of said first level wiring, selectively.

6. The multi-level wiring structure as claimed in claim 5, wherein said organic insulating film is made of a material selected from polyimide, epoxy or Teflon.

7. A multi-level wiring structure, comprising:
a first level wiring having a laminated structure formed on a major surface of a first organic insulating film, said first level wiring having a first bonding pad and a first strip line extending from said first bonding pad;

a second organic insulating film covering a part of said first strip line of said first level wiring and said first organic insulating film except said first bonding pad and a remaining part of said first strip line of said first level wiring, successively; and a second level wiring having a laminated structure formed on a major surface of said second organic insulating film, said second level wiring having a second bonding pad and a second strip line extending from said second bonding pad, each of said first and second bonding pads being provided as an external-lead-out terminal for said multi-level wiring structure;

wherein the Vickers hardness of a first portion composed of said first bonding pad and said first organic insulating film formed thereunder is more than 100 and a second portion composed of said second bonding pad, said second organic insulating film, said first level wiring and said first organic insulating film is more than 100.

8. The multi-level wiring structure as claimed in claim 7, wherein a nickel layer is provided with said broad width part of said first level wiring, selectively.

9. The multi-level wiring structure as claimed in claim 8, wherein said first organic insulating film is made of a material selected from polyimide, epoxy or Teflon and said second organic insulating film is made of a material selected from polyimide, epoxy or Teflon.

10. The multi-level wiring structure as claimed in claim 1, wherein said second level wiring of a laminated structure includes an adhesive metal layer, a barrier metal layer, said nickel layer and said gold layer.

11. The multi-level wiring structure as claimed in claim 10, wherein said adhesive metal layer includes titanium and said barrier metal layer includes copper.

12. The multi-level wiring structure as claimed in claim 10, wherein said adhesive metal layer is made of a material selected from chromium or palladium, and said barrier metal layer is made of a material selected from nickel, a copper-palladium alloy, a titanium-copper alloy, platinum or palladium.

13. The multi-level wiring structure as claimed in claim 1, wherein said total Vickers hardness varies in accordance with the nickel layer thickness.

14. The multi-level wiring structure as claimed in claim 2, wherein said tapered wall is at an angle in the range of 30 to 70 degrees.

15. The multi-level wiring structure as claimed in claim 3, wherein a nickel layer is selectively provided with said first level wiring at a portion underneath said bonding pad.

16. The multi-level wiring structure as claimed in claim 15, wherein said adhesive metal layer includes titanium and said barrier metal layer includes copper.

17. The multi-level wiring structure as claimed in claim 3, wherein said total Vickers hardness varies in accordance with the nickel layer thickness.

18. The multi-level wiring structure as claimed in claim 7, wherein said first level wiring having a laminated structure includes an adhesive metal layer, a barrier metal layer, a nickel layer and a gold layer.

19. The multi-level wiring structure as claimed in claim 18, wherein said adhesive metal layer includes titanium and said barrier metal layer includes copper.

20. The multi-level wiring structure as claimed in claim 7, wherein said second level wiring having a laminated structure includes an adhesive metal layer, a barrier metal layer, said nickel layer, and a gold layer.

21. The multi-level wiring structure as claimed in claim 20, wherein said adhesive metal layer includes titanium and said barrier metal layer includes copper.

22. The multi-level wiring structure as claimed in claim 20, wherein said first level wiring having a laminated structure includes an adhesive metal layer, a barrier metal layer, a nickel layer and a gold layer.

23. The multi-level wiring structure as claimed in claim 22, wherein said adhesive metal layer of said first level wiring and said adhesive metal layer of said second level wiring includes titanium, and said barrier metal layer of said first level wiring and said barrier metal layer of said second level wiring includes copper.

24. The multi-level wiring structure as claimed in claim 7, wherein said total Vickers hardness varies in accordance with the nickel layer thickness.

* * * * *